(12) United States Patent
Seki (10) Patent No.: US 11,569,395 B2
(45) Date of Patent: Jan. 31, 2023

(54) SOLAR POWER GENERATOR, SOLAR ARRAY WING, AND SPACE STRUCTURE

(71) Applicant: Mitsubishi Electric Corporation, Chiyoda-ku (JP)

(72) Inventor: Kazuyoshi Seki, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 714 days.

(21) Appl. No.: 16/091,866

(22) PCT Filed: Apr. 22, 2016

(86) PCT No.: PCT/JP2016/062811
§ 371 (c)(1),
(2) Date: Oct. 5, 2018

(87) PCT Pub. No.: WO2017/183195
PCT Pub. Date: Oct. 26, 2017

(65) Prior Publication Data
US 2019/0131464 A1 May 2, 2019

(51) Int. Cl.
*H01L 31/02* (2006.01)
*H02S 40/36* (2014.01)
(Continued)

(52) U.S. Cl.
CPC .......... *H01L 31/02013* (2013.01); *B64G 1/10* (2013.01); *B64G 1/44* (2013.01);
(Continued)

(58) Field of Classification Search
CPC .......... H01L 31/0201; H01L 31/02013; H01L 31/02008; H01L 31/041; H02S 40/36
See application file for complete search history.

(56) References Cited

U.S. PATENT DOCUMENTS 6,543,725 B1    4/2003  Meurer et al.
2011/0290296 A1 12/2011 Jurgen et al.
(Continued)

FOREIGN PATENT DOCUMENTS

JP    10-264899 A   10/1988
JP    2-73748 U     6/1990
(Continued)

OTHER PUBLICATIONS

Extended European Search Report dated May 17, 2019 in Patent Application No. 16899467.1, 8 pages.
(Continued)

*Primary Examiner* — Ryan S Cannon
(74) *Attorney, Agent, or Firm* — Oblon, McClelland, Maier & Neustadt, L.L.P.

(57) ABSTRACT

A solar power generator includes a support, a plurality of first electrodes disposed on one side of the support, a solar cell module mounted to the support, and a plurality of second electrodes disposed on the opposite side of the support. The solar cell module is electrically connected to a pair of the first electrodes via a transmission line for module connection. Three pairs of the second electrodes are electrically connected one-to-one to three pairs of the first electrodes via a transmission line for passage of current. Three of the second electrodes are electrically connected to one of the first electrode via the transmission line for passage of current.

9 Claims, 7 Drawing Sheets

(51) Int. Cl.
*B64G 1/44* (2006.01)
*B64G 1/10* (2006.01)
*H01L 31/05* (2014.01)

(52) U.S. Cl.
CPC .......... *B64G 1/443* (2013.01); *H01L 31/0201* (2013.01); *H02S 40/36* (2014.12); *H01L 31/0504* (2013.01)

(56) References Cited

U.S. PATENT DOCUMENTS

2012/0013191 A1* 1/2012 Jeandeaud .............. H02S 40/34
                                                                307/80
2015/0364631 A1* 12/2015 Aiken ............. H01L 31/022425
                                                                136/251
2018/0138352 A1* 5/2018 Aiken ................. H01L 31/0512

FOREIGN PATENT DOCUMENTS

| JP | 10-264899 A | 10/1998 |
|----|-------------|---------|
| JP | 2002-522926 A | 7/2002 |
| JP | 2012-158333 A | 8/2012 |
| WO | WO 00/10207 A1 | 2/2000 |

OTHER PUBLICATIONS

International Search Report dated Jul. 26, 2018, In PCT/JP2016/062811 filed Apr. 22, 2016.
Office Action dated Mar. 5, 2019 in Japanese Patent Application No. 2018-512752, 6 pages (with unedited computer generated English translation).

* cited by examiner

Fig. 2

SOLAR POWER GENERATOR, SOLAR ARRAY WING, AND SPACE STRUCTURE

TECHNICAL FIELD

The present invention relates to a solar power generator, a solar array wing, and a space structure.

BACKGROUND ART

A solar array wing includes a plurality of solar panels to generate power required by a satellite. Each of the panels is connected to the body of the satellite by wiring in order to supply power generated in each of the panels to the body of the satellite. That is, a transmission line is installed at the back of each of the panels for allowing passage of current from the panel placed on the outer side. The area of installation of the transmission line varies from panel to panel so that wiring design specific to each panel is required. The larger the number of types of drawings, the longer the time required for designing and the greater the risk of occurrence of a problem due to design and manufacturing errors. This also applies to a solar array wing including a plurality of solar array blankets instead of the plurality of solar panels, as in a solar array wing described in Patent Literature 1.

In order to disuse the transmission line as described above, a solar array wing described in Patent Literature 2 connects solar cells in series by integrated inner current conduction path system and outer current conduction path system. Specifically, the series circuit of solar cells extends across a plurality of solar array blankets in the direction of expansion thereof and makes a U-turn at a position farthest from the body of the satellite via wiring of the outer current conduction path system. The series circuit of solar cells then extends across the plurality of solar array blankets again in the direction of expansion thereof and is led to a processing system of the body of the satellite via wiring of the inner current conduction path system. The solar cells are connected in series within the same module or connected in series between different modules by contact welding.

CITATION LIST

Patent Literature

Patent Literature 1: JP2012-158333 A
Patent Literature 2: JP 2002-522926 A

SUMMARY OF INVENTION

Technical Problem

In the solar array wing described in Patent Literature 2, the power supply line has to go through the outer current conduction path system to reach the body of the satellite depending on the module, and is thus increased in length and causes an excessive voltage drop.

An object of the present invention is to reduce the risk of occurrence of a problem while adopting a transmission line that allows for passage of current.

Solution to Problem

A solar power generator according to one aspect of the present invention includes:
a support provided with a plurality of transmission lines;
a plurality of first electrodes disposed on one side of the support;
a solar cell module mounted on the support and electrically connected to a part of the plurality of first electrodes via a part of the plurality of transmission lines; and
a plurality of second electrodes disposed on an opposite side of the support from the side on which the plurality of first electrodes is disposed, wherein
the plurality of second electrodes includes a second electrode electrically connected one-to-one to the rest of the plurality of first electrodes via the rest of the plurality of transmission lines, and a second electrode electrically connected many-to-one to the rest of the first electrodes via the rest of the transmission lines.

Advantageous Effects of Invention

According to the present invention, the wiring design of the transmission line that allows for passage of current can be standardized among the solar power generators. As a result, the number of types of drawings, the time required for designing, and the risk of occurrence of a problem due to design and manufacturing errors can be reduced.

DESCRIPTION OF EMBODIMENTS

Embodiments of the present invention will now be described with reference to the drawings. Note that parts that are identical or equivalent to each other in the drawings are denoted by the same reference numerals. Descriptions of the parts that are identical or equivalent to each other will be omitted or simplified as appropriate in the description of the embodiments. Moreover, in the description of the embodiments, the arrangement or orientation such as "upper", "lower", "left", "right", "front", "rear", "the front", or "the back" is denoted as such for the purpose of illustration and does not limit the arrangement or orientation of a device, an instrument, a part, and the like. The material, shape, size, and the like of the configuration of a device, an instrument, a part, and the like can be modified as appropriate within the scope of the present invention.

First Embodiment

The present embodiment will be described with reference to FIGS. 1 to 3.
Description of Configuration
The configuration of a space structure 10 according to the present embodiment will be described with reference to FIGS. 1 and 2.

The space structure 10 is a satellite in the present embodiment but may be a space structure of another kind such as a space station.

The space structure 10 includes a solar array wing 11 and a structure body 12.

The abbreviation for the solar array wing 11 is SAW. In the present embodiment, the solar array wing 11 is connected to both sides of the structure body 12 by a yoke 13.

The solar array wing 11 includes a plurality of solar power generators 30 connected to one another. Four of the solar power generators 30 are included in the present embodiment where two or more thereof may be included in the "plurality of solar power generators 30". In the present embodiment, the four of the solar power generators 30 are connected in a straight line along the direction of expansion of the solar array wing 11.

The solar power generators 30 are solar panels in the present embodiment. Specifically, the solar power generator 30 is formed such that solar cells 16 and wiring 17 are mounted on the front surface and the back surface of a support 31, respectively. The support has a structure in which a honeycomb core 14 made of aluminum is sandwiched between face sheets 15 made of carbon fiber reinforced plastic. The abbreviation for the carbon fiber reinforced plastic is CFRP. Note that the material of the honeycomb core 14 is not limited to aluminum but may be another materials such as carbon or the like.

The abbreviation for the solar cell 16 is SC. The solar cell 16 is simply referred to as a "cell" in some cases. The lower surface of the solar cell 16 is stuck on the front surface of the support 31 with an adhesive 18. The upper surface of the solar cell 16 is covered with protective cover glass 19. The solar cells 16 adjacent to each other are electrically connected to each other by an interconnector 20.

In the present embodiment, the wiring 17 is a cable formed of a copper wire or another core wire that is coated, but may be wiring of another kind such as a blanket with a copper foil pattern embedded therein or the like.

The structure body 12 is a satellite bus in the present embodiment. The structure body 12 is connected to one side of the support 31 of one of the plurality of solar power generators 30. The "one of the plurality of solar power generators 30" is the closest to the structure body 12 and thus corresponds to the innermost solar power generator 30.

The configuration of the solar array wing 11 will be described in detail with reference to FIG. 3.

As described above, the solar array wing 11 of the present embodiment includes the four solar power generators 30 connected to one another.

In addition to the support 31 described above, the solar power generator 30 includes a plurality of first electrodes 32, 33, and 34, a solar cell module 35, and a plurality of second electrodes 36 and 37.

The support 31 is provided with a plurality of transmission lines 38 and 39. The transmission line 38 being a part of the plurality of transmission lines 38 and 39 is for module connection, and the transmission line 39 being the rest of the plurality of transmission lines 38 and 39 is for passage of current.

The plurality of first electrodes 32, 33, and 34 is disposed on one side of the support 31. The "one side" corresponds to the left side in FIG. 3.

The solar cell module 35 is a module in which the solar cells 16 described above are connected in series. Although any number of the solar cells 16 may be connected, 11 solar cells are connected in each solar cell module 35 in the present embodiment. The solar cell module 35 is attached to the support 31. Although any number of the solar cell modules 35 may be attached, four solar cell modules are attached to each support 31 in the present embodiment. The four solar cell modules 35 attached to the same support 31 are connected in parallel with one another.

The solar cell module 35 is electrically connected to the first electrode 32 being a part of the plurality of first electrodes 32, 33, and 34 via the transmission line 38 for module connection. In the present embodiment, among the 11 solar cells 16 of the solar cell module 35, the solar cell 16 on the side of the highest potential and the solar cell 16 on the side of the lowest potential are each welded to a module electrode 40. The module electrode 40 on the high potential side is electrically connected to one of the first electrodes 32 via the transmission line 38 for module connection. The module electrodes 40 on the high potential side of the four solar cell modules 35 attached to the same support 31 are also electrically connected to one another via the transmission line 38 for module connection. The module electrode 40 on the low potential side is electrically connected to another one of the first electrodes 32 via the transmission line 38 for module connection. The module electrodes 40 on the low potential side of the four solar cell modules 35 attached to the same support 31 are also electrically connected to one another via the transmission line 38 for module connection.

The plurality of second electrodes 36 and 37 is disposed on the opposite side of the support 31 from the side of the plurality of first electrodes 32, 33, and 34. The "opposite side" corresponds to the right side in FIG. 3.

The plurality of second electrodes 36 and 37 is electrically connected one-to-one or many-to-one to the rest of the plurality of first electrodes 32, 33, and 34, that is, the first electrodes 33 and 34 excluding the first electrodes 32 electrically connected to the solar cell module 35. Specifically, the second electrode 36 being a part of the plurality of second electrodes 36 and 37 is electrically connected one-to-one to the first electrode 33 via the transmission line 39 for passage of current. The second electrode 37 being the rest of the plurality of second electrodes 36 and 37 is electrically connected many-to-one to the first electrode 34 via the transmission line 39 for passage of current. In the present embodiment, three of the second electrodes 37 are electrically connected to one first electrode 34.

Where $i=2, \ldots, (n-1)$, the first solar power generator 30 counted from the outer side is connected to the second solar power generator 30, the i-th solar power generator 30 is connected to the (i+1)-th solar power generator 30, and the n-th solar power generator 30 is connected to the structure body 12. The present embodiment is the case where $n=4$.

As for the first solar power generator 30, the second solar power generator 30 is connected as an external device to one side of the support 31 by a connecting member 41. The connecting member 41 is specifically a cable similar to the wiring 17. The plurality of first electrodes 32, 33, and 34 disposed on the one side of the support 31 is electrically connected one-to-one to the plurality of second electrodes 36 and 37 of the second solar power generator 30. Nothing is connected to the opposite side of the support 31. Power generated by the solar cell module 35 is transmitted to the first electrode 32 electrically connected to the solar cell module 35 via the transmission line 38 for module connection, and is output from the first electrode 32 to the second solar power generator 30. The power output from the first electrode 32 is input to the second electrode 36 of the second solar power generator 30.

As for the i-th solar power generator 30, the (i+1)-th solar power generator 30 is connected as an external device to one side of the support 31 by the connecting member 41. The plurality of first electrodes 32, 33, and 34 disposed on the one side of the support 31 is electrically connected one-to-one to the plurality of second electrodes 36 and 37 of the (i+1)-th solar power generator 30. The (i−1)-th solar power generator 30 is connected as another solar power generator 30 to the opposite side of the support 31 via the connecting member 41. Power generated by the solar cell module 35 is transmitted to the first electrode 32 electrically connected to the solar cell module 35 via the transmission line 38 for module connection, and is output from the first electrode 32 to the (i+1)-th solar power generator 30. Moreover, the power input from the (i−1)-th solar power generator 30 to the second electrode 36 electrically connected one-to-one to the first electrode 33 is transmitted to the connected first electrode 33 via the transmission line 39 for passage of current, and is output from the connected first electrode 33 to the (i+1)-th solar power generator 30. The power output from the first electrodes 32 and 33 is input to the second electrode 36 of the (i+1)-th solar power generator 30.

As for the n-th solar power generator 30, the structure body 12 is connected as an external device to one side of the support 31 by the yoke 13. The plurality of first electrodes 32, 33, and 34 disposed on the one side of the support 31 is electrically connected one-to-one to a plurality of electrodes (not illustrated) of the structure body 12. The (n−1)-th solar power generator 30 is connected as another solar power generator 30 to the opposite side of the support 31 via the connecting member 41. Power generated by the solar cell module 35 is transmitted to the first electrode 32 electrically connected to the solar cell module 35 via the transmission line 38 for module connection, and is output from the first electrode 32 to the structure body 12. Moreover, the power input from the (n−1)-th solar power generator 30 to the second electrode 36 electrically connected one-to-one to the first electrode 33 is transmitted to the connected first electrode 33 via the transmission line 39 for passage of current, and is output from the connected first electrode 33 to the structure body 12. The power output from the first electrodes 32 and 33 is used or stored by the structure body 12.

As described above, in the present embodiment, the transmission line 39 is placed in each of the solar power generators 30 to allow for passage of current from the solar power generator 30 placed on the outer side. At least two solar power generators 30 of the plurality of solar power generators 30 included in the solar array wing 11 include the wiring 17 of the same pattern as the transmission line 39. Specifically, all the solar power generators 30 include the wiring 17 of the same pattern as the transmission line 39. As a result, the number of types of drawings used at the time of designing and manufacturing the solar power generator 30 is reduced, whereby the time required for designing and the risk of occurrence of a problem due to design and manufacturing errors can be reduced.

Although the four solar cell modules 35 are electrically connected to the pair of the first electrodes 32 for each solar power generator 30 in the present embodiment, the number of the first electrodes 32 can be changed as appropriate. As a specific example, two of the solar cell modules 35 may be electrically connected to a pair of the first electrodes 32, and another two of the solar cell modules 35 may be electrically connected to another pair of the first electrodes 32. Note that the number of the solar cell modules 35 can also be changed as appropriate as described above. Moreover, although the orientations of the solar cell modules 35 in the present embodiment are opposite to each other between the solar power generators 30 adjacent to each other considering the magnetic moment, the orientations of the solar cell modules 35 can also be changed as appropriate.

In the present embodiment, three pairs of the second electrodes 36 are electrically connected one-to-one to three pairs of the first electrodes 33 for each solar power generator 30, whereby two or more and four or fewer solar power generators 30 can be connected along the direction of expansion of the solar array wing 11. Note that the number of the second electrodes 36 and the first electrodes 33 can each be changed as appropriate. As a specific example, five pairs of the second electrodes 36 may be electrically connected one-to-one to five pairs of the first electrodes 33. In that case, two or more and six or fewer solar power generators 30 can be connected along the direction of expansion of the solar array wing 11.

In the present embodiment, the three second electrodes 37 are electrically connected to the one first electrode 34 in each solar power generator 30. That is, among the plurality of second electrodes 36 and 37, not only the second electrode 36 included in the power supply line but also the second electrode 37 not included in the power supply line are electrically connected to any of the plurality of first electrodes 33 and 34. As a result, a floating conductor does not appear even when the second electrode 37 and the transmission line 39 for passage of current connected to the second electrode 37 are charged by the influence of radiation and cosmic rays. This can prevent a failure of the solar power generator 30 caused by the floating conductor. Note that the number of the second electrodes 37 and the first electrodes 34 can each be changed as appropriate. As a specific example, two of the second electrodes 37 may be electrically connected to one first electrode 34, and another two of the second electrodes 37 may be electrically connected to another first electrode 34.

In the present embodiment, among the plurality of solar power generators 30 included in the solar array wing 11, the first electrode 34 connected to the second electrode 37 in one of the two solar power generators 30 connected to each other is connected to one second electrode 37 of the second electrodes 37 in the other one of the two solar power generators 30. As a result, a floating conductor does not appear even when the second electrode 37 in the one of the two solar power generators 30, the transmission line 39 for passage of current connected to the second electrode 37, and the first electrode 34 connected to the transmission line 39 are charged by the influence of radiation and cosmic rays. This can prevent a failure of the solar power generator 30 caused by the floating conductor.

In the present embodiment, the first electrode 32 to which the solar cell module 35 is electrically connected, the first electrode 33 to which the second electrode 36 is electrically connected one-to-one, and the first electrode 34 to which the second electrode 37 is electrically connected many-to-one are disposed in order from both ends of the support 31 of each solar power generator 30 toward the center thereof. The "both ends" correspond to upper and lower ends in FIG. 3.

In the first and outermost solar power generator 30, the power generated by the solar cell module 35 is transmitted from the module electrode 40 to the second solar power generator 30 via the transmission line 38 for module connection, the first electrode 32, and the connecting member 41. In the second solar power generator 30, the power transmitted from the first solar power generator 30 is transmitted from the second electrode 36 to the third solar power generator 30 via the transmission line 39 for passage of current, the first electrode 33, and the connecting member 41. Similarly, the power is transmitted inward in the third solar power generator 30 and the fourth solar power generator 30.

In the present embodiment, the first electrode 32 or the first electrode 33 and the second electrode 36 are connected obliquely dislocating by one step between the solar power generators 30. As a result, the power passes the transmission line 39 that is one line closer to the center every time the power is transferred to the solar power generator 30 on the inner side. Adapting such a configuration, in the present embodiment, the solar power generators 30 having the transmission lines of the same pattern can be connected to each other.

Furthermore, in the present embodiment, the three-way transmission line 39 at the center of the solar power generator 30 allows for electrical connection of all the transmission lines 39 including the transmission line 39 in the center that is not used in the solar power generator 30 on the outer side. This can prevent the appearance of a floating conductor at the center of the solar power generator 30.

Description of Effect of Embodiment

According to the present embodiment, the wiring design of the transmission line 39 that allows for passage of current can be standardized among the solar power generators 30. As a result, the number of types of drawings, the time required for designing, and the risk of occurrence of a problem due to design and manufacturing errors can be reduced.

According to the present embodiment, the transmission line 39 for passage of current of all the solar panels can be designed in the same pattern regardless of the number of the solar panels. That is, universal design can be implemented. The following three effects can be expected from the universal design. The first is reduction in design cost by reduction in the number of types of drawings. The second is reduction in the risk of occurrence of a problem due to design and manufacturing errors as a result of standardization of the wiring design. The third is reduction in the risk of shipment delays as a result of the panels being replaceable.

Another Configuration

Figure 2:
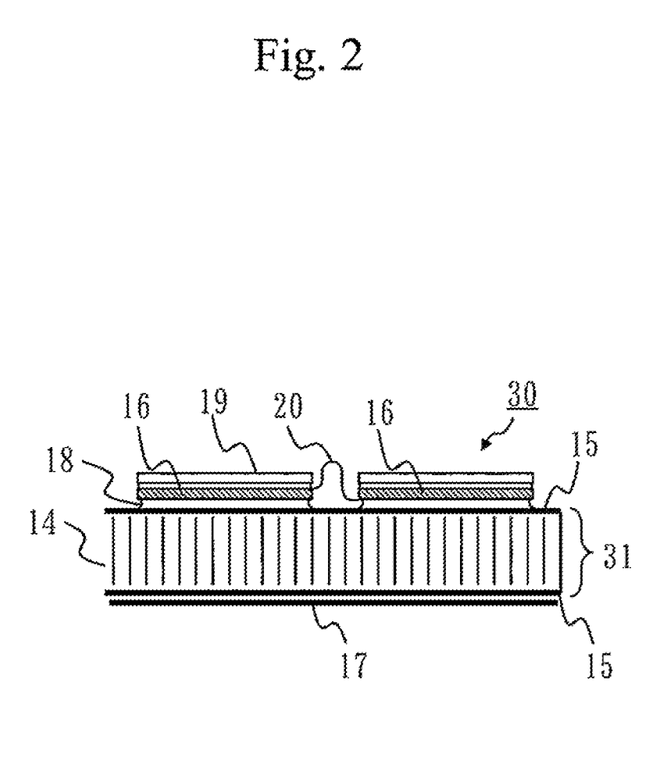
FIG. 2 is a cross-sectional view of a part of a solar power generator according to the first embodiment.
Figure 3:
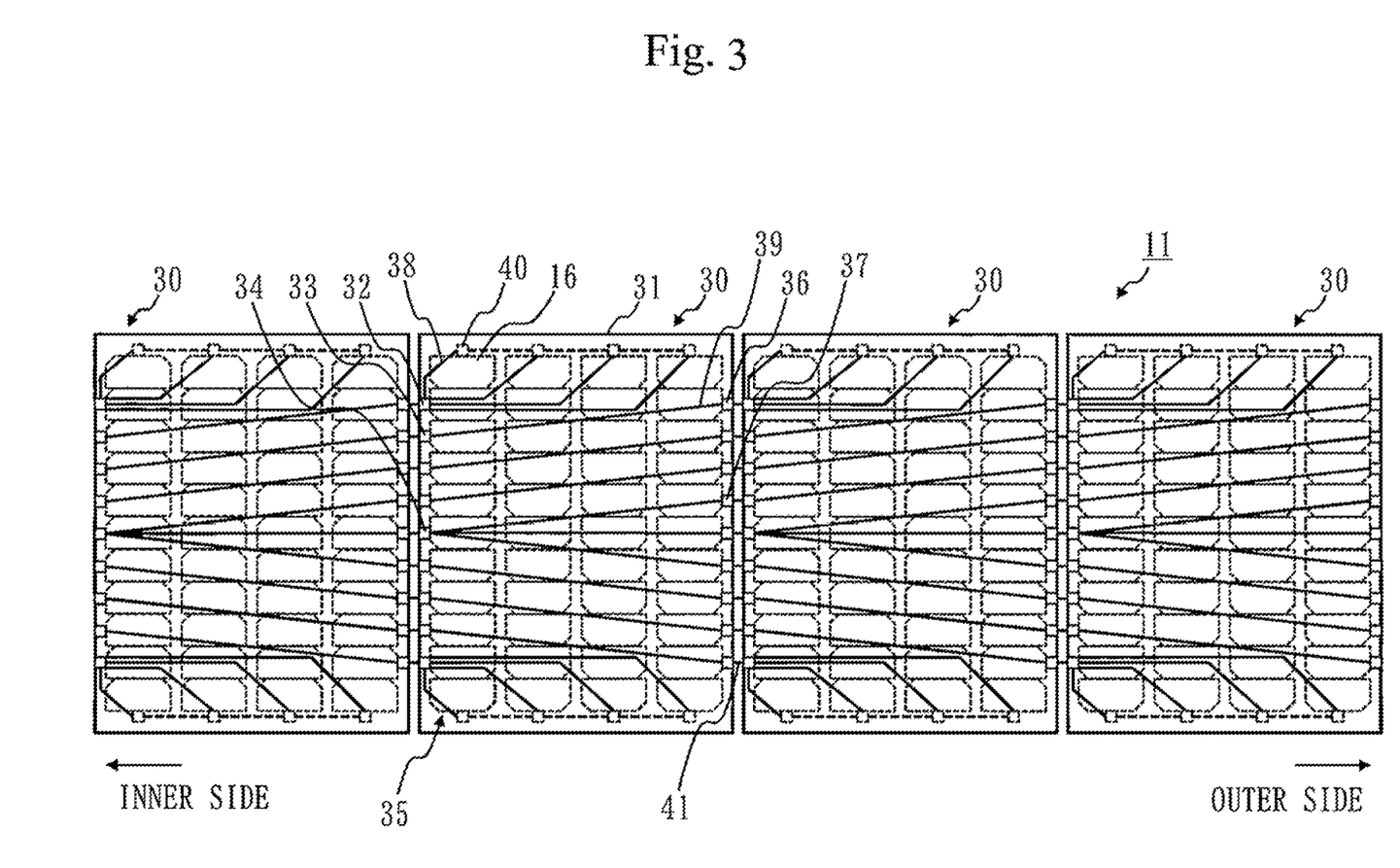
FIG. 3 is a block diagram illustrating a configuration of a solar array wing according to the first embodiment.
Figure 4:
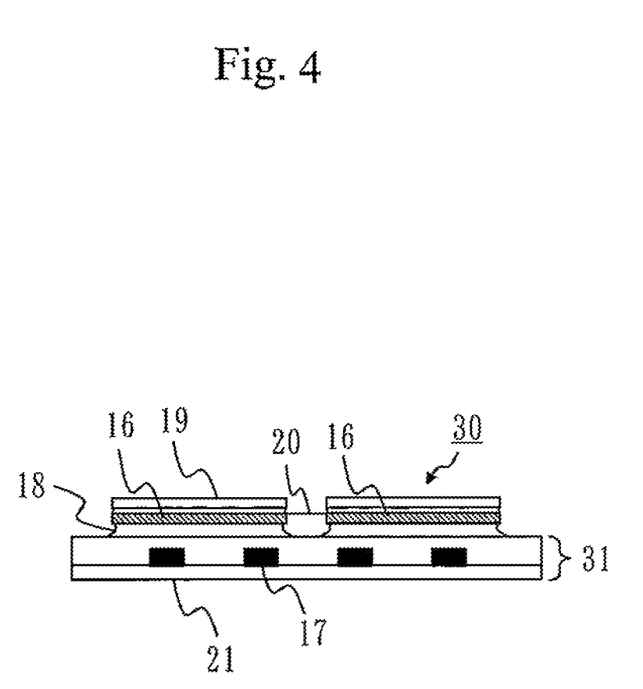
FIG. 4 is a cross-sectional view of a part of a solar power generator according to a variation of the first embodiment.

Although the solar power generator 30 of the present embodiment is configured as the solar panel illustrated in FIG. 2, the solar power generator 30 may be configured as a solar array blanket illustrated in FIG. 4 as a variation.

The solar power generator 30 of the present variation is formed such that the solar cell 16 is mounted on the front surface of the support 31 having the structure in which the wiring 17 is sandwiched by a polyimide film 21.

The solar cell 16 is the same as that illustrated in FIG. 2 and thus will not be described.

The wiring 17 is specifically a copper foil pattern.

The support 31 has flexibility in the present variation. Thus, the plurality of first electrodes 32, 33, and 34 and the plurality of second electrodes 36 and 37 may be directly welded and electrically connected one-to-one between the solar power generators 30 adjacent to each other. The connecting member 41 is unnecessary in that case.

In the solar array wing described in Patent Literature 1, the transmission line that allows for passage of current is disposed inside the beam so that the cross sectional area thereof needs to be increased in a case where the area of the solar array blanket is increased by increasing the number of solar array blankets. On the other hand, in the variation above, the transmission lines involved in the connection between the blankets are connected while shifted by one step between the blankets, whereby the transmission lines can be configured efficiently in accordance with an increase in the number of blankets.

Second Embodiment

Figure 5:
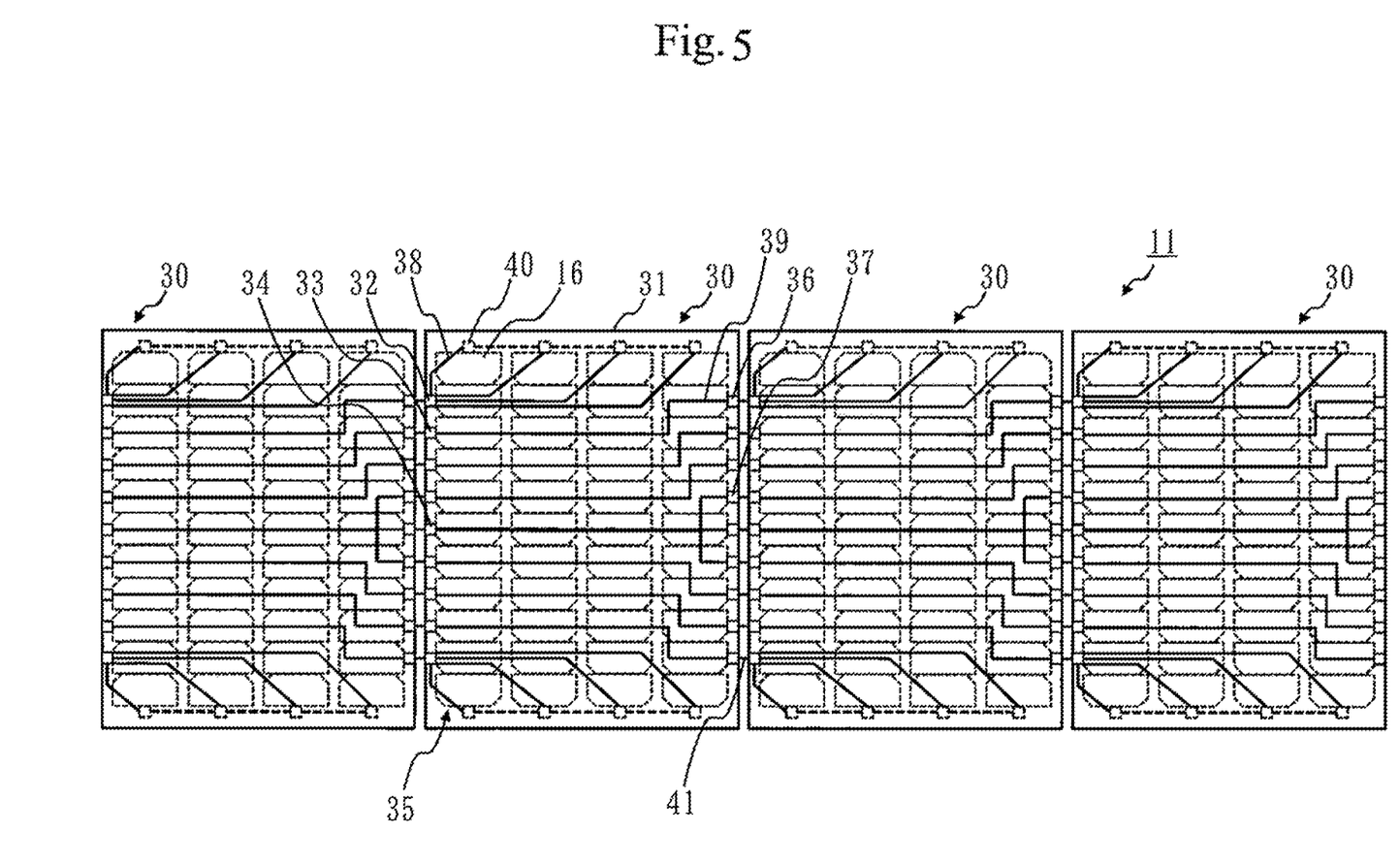
FIG. 5 is a block diagram illustrating a configuration of a solar array wing according to a second embodiment.

The present embodiment will be described with reference to FIG. 5 mainly focusing on differences from the first embodiment.

Description of Configuration

Figure 1:
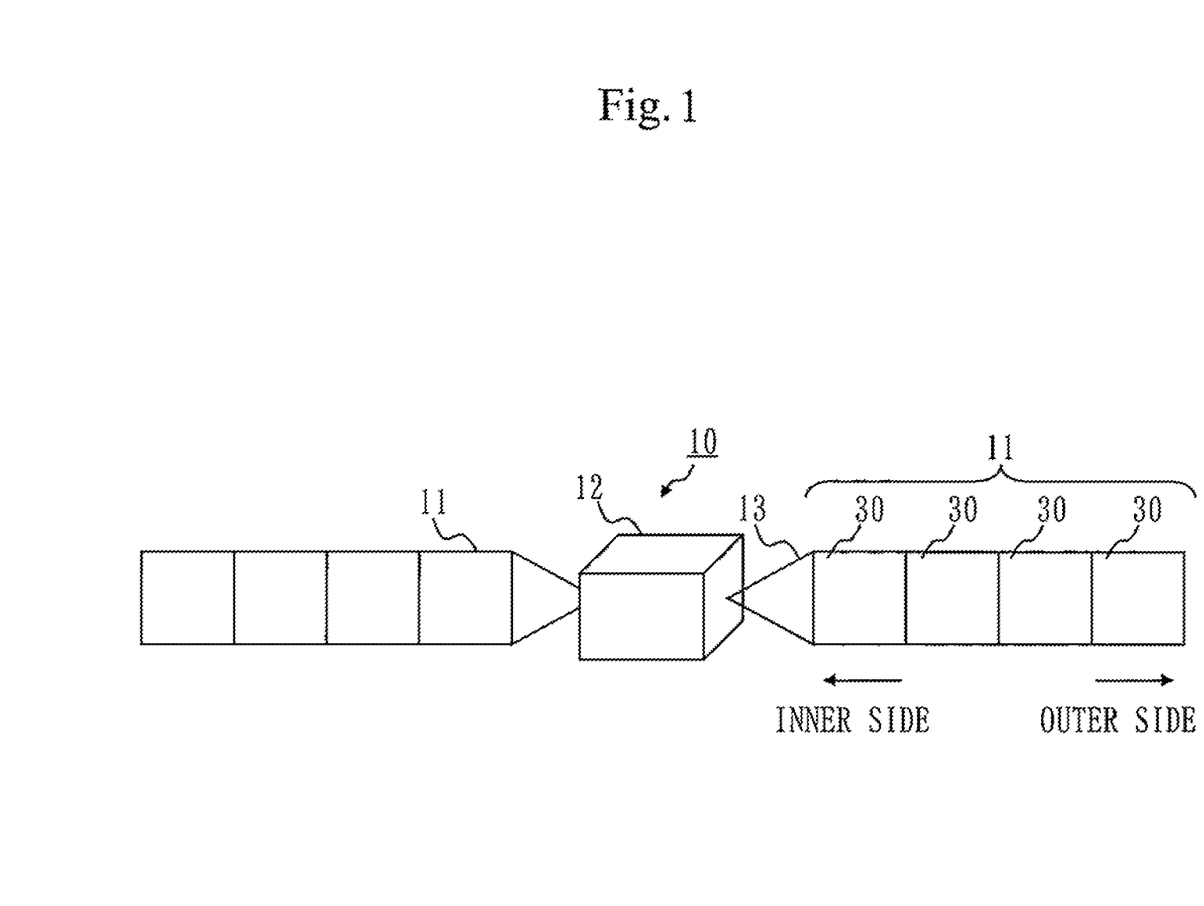
FIG. 1 is a schematic diagram of a space structure according to a first embodiment.

The configuration of the space structure 10 according to the present embodiment is the same as that of the first embodiment illustrated in FIG. 1, and thus will not be described.

Although the solar power generator 30 of the present embodiment is configured as the solar panel as illustrated in FIG. 2, the solar power generator 30 may be configured as the solar array blanket illustrated in FIG. 4 as with the variation of the first embodiment.

The configuration of the solar array wing 11 will be described in detail with reference to FIG. 5.

The solar array wing 11 of the present embodiment also includes four of the solar power generators 30 connected to one another.

In the present embodiment, the first electrode 32 or the first electrode 33 and the second electrode 36 are connected stepwise dislocating by one step between the solar power generators 30. As a result, the power passes the transmission line 39 that is one line closer to the center every time the power is transferred to the solar power generator 30 on the inner side. Adapting such a configuration, in the present embodiment, the solar power generators 30 having the transmission lines of the same pattern can be connected to each other.

Furthermore, in the present embodiment, the three-way transmission line 39 at the center of the solar power generator 30 allows for electrical connection of all the transmission lines 39 including the transmission line 39 in the center that is not used in the solar power generator 30 on the outer side. This can prevent the appearance of a floating conductor at the center of the solar power generator 30.

Description of Effect of Embodiment

The present embodiment can obtain an effect equivalent to that of the first embodiment.

Third Embodiment

Figure 6:
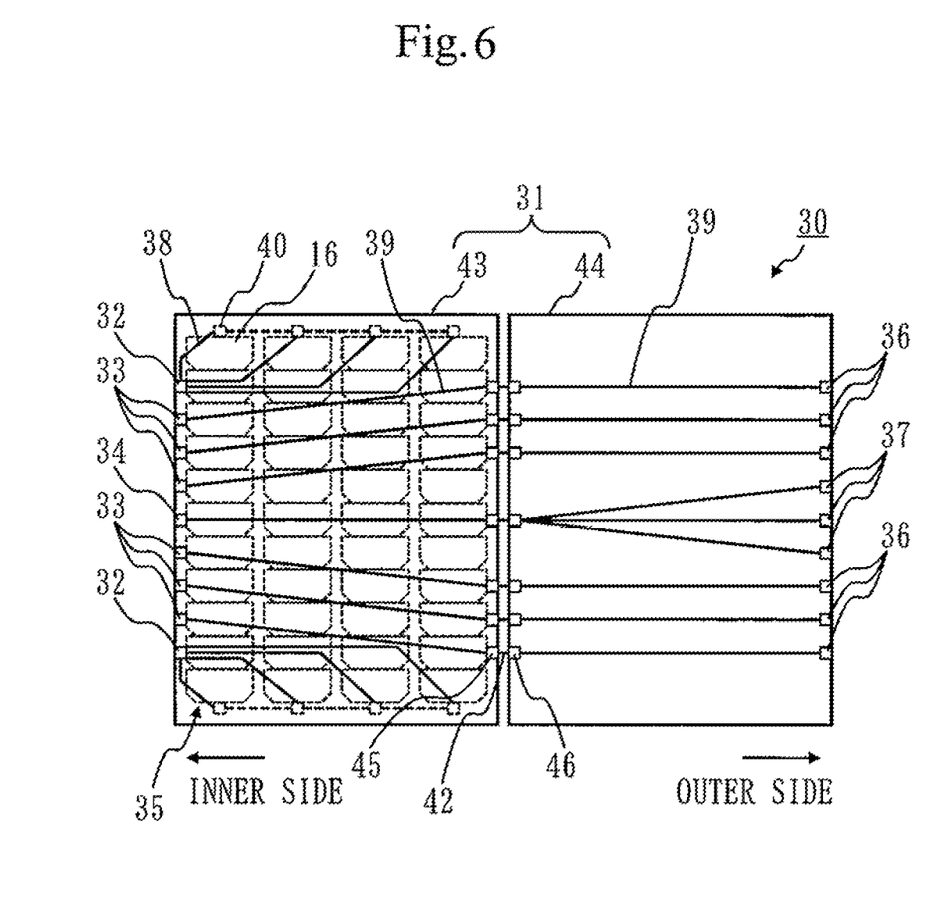
FIG. 6 is a block diagram illustrating a configuration of a solar power generator according to a third embodiment.

The present embodiment will be described with reference to FIG. 6 mainly focusing on differences from the first embodiment.

Description of Configuration

The configuration of the space structure 10 according to the present embodiment is the same as that of the first embodiment illustrated in FIG. 1, and thus will not be described.

The solar array wing 11 of the present embodiment also includes four of the solar power generators 30 connected to one another.

The configuration of the solar power generator 30 will be described in detail with reference to FIG. 6.

The solar power generator 30 includes a plurality of panels 43 and 44 as the support 31. The "plurality of panels 43 and 44" includes the panel 43 to which the solar cell module 35 is attached and the panel 44 to which the solar cell module 35 is not attached. Although any number of each of the panels 43 and 44 may be included, the present embodiment includes one of each of the panels. Each of the panels 43 and 44 has the structure in which the honeycomb core 14 is sandwiched between the face sheet 15 as illustrated in FIG. 2. The wiring 17 is mounted on the back surface of each of the panels, while the solar cells 16 are mounted on the front surface of only one panel 43.

The support 31 is divided into the two panels 43 and 44 as described above in the present embodiment. These two panels 43 and 44 are connected to each other by a connecting member 42. The connecting member 42 is specifically a cable similar to the connecting member 41 used for connection between the solar power generators 30.

The plurality of first electrodes 32, 33, and 34 is disposed on the panel 43 on one side of the support 31. Specifically, the plurality of first electrodes 32, 33, and 34 is disposed on one side of the panel 43. The solar cell module 35 is attached to the panel 43 on the one side of the support 31. The plurality of second electrodes 36 and 37 is disposed on the panel 44 on the opposite side of the support 31. Specifically, the plurality of second electrodes 36 and 37 is disposed on a side of the panel 44 opposite to a side thereof connected to the panel 43.

Thus, as with the first embodiment, the support 31 of the present embodiment as a whole is structured such that the plurality of first electrodes 32, 33, and 34 is disposed on the one side of the support 31 while the plurality of second electrodes 36 and 37 is disposed on the opposite side of the support 31.

In the present embodiment, the panel 43 to which the solar cell module 35 is attached includes a plurality of third electrodes 45 disposed on a side of the panel opposite to the side on which the plurality of first electrodes 32, 33, and 34 is disposed. Moreover, a plurality of fourth electrodes 46 is disposed on one side of the panel 44 to which the solar cell module 35 is not attached. The plurality of third electrodes 45 disposed on the one panel 43 is electrically connected one-to-one to the plurality of fourth electrodes 46 disposed on the other panel 44 via the connecting member 42.

The transmission line 38 for module connection is provided on the panel 43 to which the solar cell module 35 is attached. The transmission line 39 for passage of current is provided across the two panels 43 and 44. The plurality of third electrodes 45 disposed on the panel 43, the connecting member 42 used for connection between the panels 43 and 44, and the plurality of fourth electrodes 46 disposed on the panel 44 form a part of the transmission line 39 for passage of current.

In the present embodiment, three of the second electrodes 37 are electrically connected to one of the fourth electrodes 46, the one of the fourth electrodes 46 is electrically connected to one of the third electrodes 45, and the one of the third electrodes 45 is electrically connected to one of the first electrodes 34. Thus, seven of each of the third electrodes 45 and the fourth electrodes 46 are disposed, but the number of each of the third electrodes 45 and the fourth electrodes 46 can be changed as appropriate. As a specific example, three of the second electrodes 37 may be electrically connected one-to-one to three of the fourth electrodes 46, the three of the fourth electrodes 46 may be electrically connected one-to-one to three of the third electrodes 45, and the three of the third electrodes 45 may be electrically connected to one of the first electrodes 34. That is, nine of each of the third electrodes 45 and the fourth electrodes 46 may be disposed.

Description of Effect of Embodiment

The present embodiment can obtain an effect equivalent to that of the first embodiment, and can also implement the configuration of the solar power generator 30 or the solar array wing 11 corresponding to various needs by increasing variations of the panels 43 and 44.

Another Configuration

Although the solar power generator 30 of the present embodiment is configured as the solar panel as in the first embodiment, the solar power generator 30 may be configured as the solar array blanket as with the variation of the first embodiment. In that case, the solar power generator 30 includes a plurality of blankets as the support 31 instead of the plurality of panels 43 and 44. Although not illustrated, the "plurality of blankets" includes a blanket to which the solar cell module 35 is attached and a blanket to which the solar cell module 35 is not attached. Any number of each of the blankets may be included. Each of the blankets has the structure in which the wiring 17 is sandwiched by the polyimide films 21 as illustrated in FIG. 4, but the solar cell 16 is mounted on the front surface of only one of the blankets.

The support 31 is divided into two or more of the blankets having flexibility in the present variation. Thus, the plurality of third electrodes 45 and the plurality of fourth electrodes 46 may be directly welded and electrically connected one-to-one between the blankets adjacent to each other. The connecting member 42 is unnecessary in that case.

Fourth Embodiment

Figure 7:
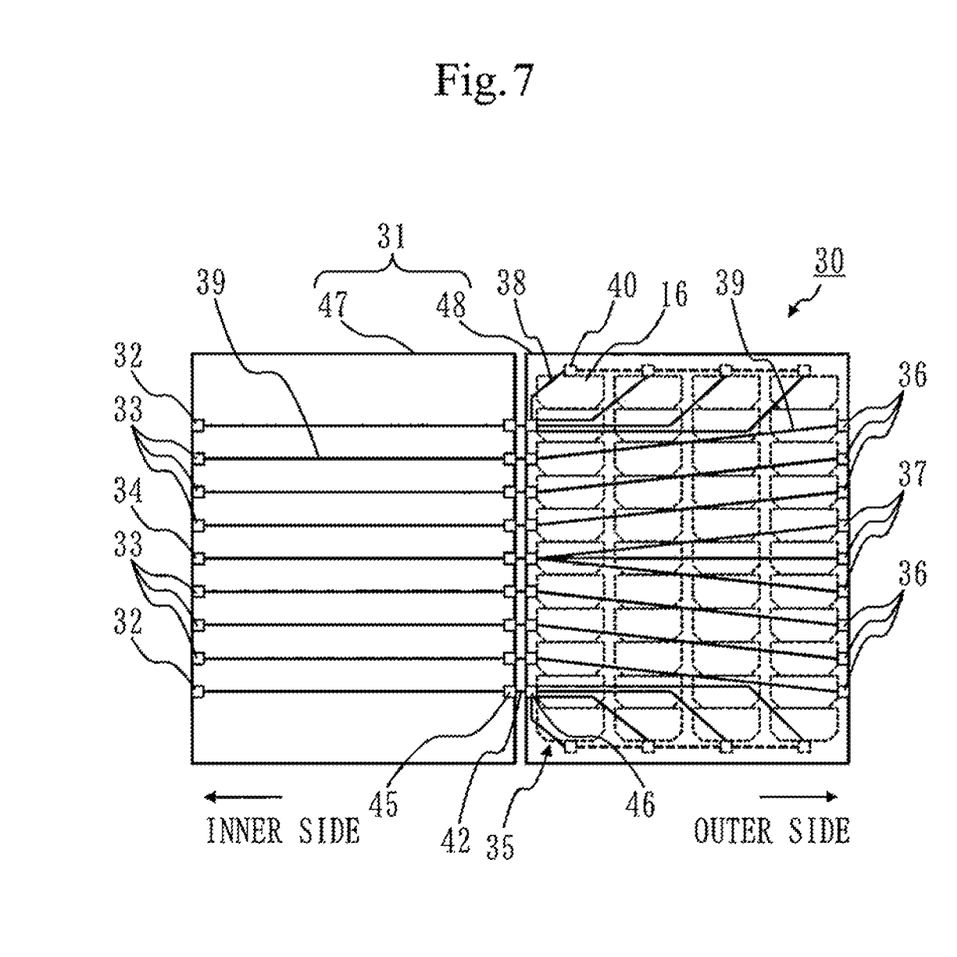
FIG. 7 is a block diagram illustrating a configuration of a solar power generator according to a fourth embodiment.

The present embodiment will be described with reference to FIG. 7 mainly focusing on differences from the first embodiment.

Description of Configuration

The configuration of the space structure 10 according to the present embodiment is the same as that of the first embodiment illustrated in FIG. 1, and thus will not be described.

The solar array wing 11 of the present embodiment also includes four of the solar power generators 30 connected to one another.

The configuration of the solar power generator 30 will be described in detail with reference to FIG. 7.

The solar power generator 30 includes a plurality of panels 47 and 48 as the support 31. The "plurality of panels 47 and 48" includes the panel 47 to which the solar cell module 35 is not attached and the panel 48 to which the solar cell module 35 is attached. Although any number of each of the panels 47 and 48 may be included, the present embodiment includes one of each of the panels. Each of the panels 47 and 48 has the structure in which the honeycomb core 14 is sandwiched between the face sheet 15 as illustrated in FIG. 2. The wiring 17 is mounted on the back surface of each of the panels, while the solar cells 16 are mounted on the front surface of only one panel 48.

The support 31 is divided into the two panels 47 and 48 as described above in the present embodiment. These two panels 47 and 48 are connected to each other by the connecting member 42. The connecting member 42 is specifically a cable similar to the connecting member 41 used for connection between the solar power generators 30.

The plurality of first electrodes 32, 33, and 34 is disposed on the panel 47 on one side of the support 31. Specifically, the plurality of first electrodes 32, 33, and 34 is disposed on one side of the panel 47. The solar cell module 35 is attached to the panel 48 on the opposite side of the support 31. The plurality of second electrodes 36 and 37 is disposed on the panel 48 on the opposite side of the support 31. Specifically, the plurality of second electrodes 36 and 37 is disposed on a side of the panel 48 opposite to a side thereof connected to the panel 47.

Thus, as with the first embodiment, the support 31 of the present embodiment as a whole is structured such that the plurality of first electrodes 32, 33, and 34 is disposed on the one side of the support 31 while the plurality of second electrodes 36 and 37 is disposed on the opposite side of the support 31.

In the present embodiment, the panel 47 to which the solar cell module 35 is not attached includes the plurality of third electrodes 45 disposed on a side of the panel opposite to the side on which the plurality of first electrodes 32, 33, and 34 is disposed. Moreover, the plurality of fourth electrodes 46 is disposed on one side of the panel 48 to which the solar cell module 35 is attached. The plurality of third electrodes 45 disposed on the one panel 47 is electrically connected one-to-one to the plurality of fourth electrodes 46 disposed on the other panel 48 via the connecting member 42.

The transmission line 38 for module connection and the transmission line 39 for passage of current are provided across the two panels 47 and 48. The plurality of third electrodes 45 disposed on the panel 47, the connecting member 42 used for connection between the panels 47 and 48, and the plurality of fourth electrodes 46 disposed on the panel 48 form a part of the transmission line 38 for module connection and a part of the transmission line 39 for passage of current.

In the present embodiment, three of the second electrodes 37 are electrically connected to one of the fourth electrodes 46, the one of the fourth electrodes 46 is electrically connected to one of the third electrodes 45, and the one of the third electrodes 45 is electrically connected to one of the first electrodes 34. Thus, nine of each of the third electrodes 45 and the fourth electrodes 46 are disposed, but the number of each of the third electrodes 45 and the fourth electrodes 46 can be changed as appropriate. As a specific example, three of the second electrodes 37 may be electrically connected one-to-one to three of the fourth electrodes 46, the three of the fourth electrodes 46 may be electrically connected one-to-one to three of the third electrodes 45, and the three of the third electrodes 45 may be electrically connected to one of the first electrodes 34. That is, 11 of each of the third electrodes 45 and the fourth electrodes 46 may be disposed.

Description of Effect of Embodiment

The present embodiment can obtain an effect equivalent to that of the first embodiment, and can also implement the configuration of the solar power generator 30 or the solar array wing 11 corresponding to various needs by increasing variations of the panels 47 and 48.

Another Configuration

Although the solar power generator 30 of the present embodiment is configured as the solar panel as in the first embodiment, the solar power generator 30 may be configured as the solar array blanket as with the variation of the first embodiment. In that case, the solar power generator 30 includes a plurality of blankets as the support 31 instead of the plurality of panels 47 and 48. Although not illustrated, the "plurality of blankets" includes a blanket to which the solar cell module 35 is not attached and a blanket to which the solar cell module 35 is attached. Any number of each of the blankets may be included. Each of the blankets has the structure in which the wiring 17 is sandwiched by the polyimide films 21 as illustrated in FIG. 4, but the solar cell 16 is mounted on the front surface of only one of the blankets.

The support 31 is divided into two or more of the blankets having flexibility in the present variation. Thus, the plurality of third electrodes 45 and the plurality of fourth electrodes 46 may be directly welded and electrically connected one-to-one between the blankets adjacent to each other. The connecting member 42 is unnecessary in that case.

Although the embodiments of the present invention have been described, two or more of those embodiments may be combined and implemented. Alternatively, one or a combination of two or more of those embodiments may be partially implemented. Note that the present invention is not to be limited by those embodiments but can be modified in various manners as needed.

REFERENCE SIGNS LIST

10: space structure, 11: solar array wing, 12: structure body, 13: yoke, 14: honeycomb core, 15: face sheet, 16: solar cell, 17: wiring, 18: adhesive, 19: cover glass, 20: interconnector, 21: polyimide film, 30: solar power generator, 31: support, 32, 33, 34: first electrode, 35: solar cell module, 36, 37: second electrode, 38, 39: transmission line, 40: module electrode, 41, 42: connecting member, 43, 44, 47, 48: panel, 45: third electrode, 46: fourth electrode.

The invention claimed is:

1. A solar power generator comprising:
   a support provided with a plurality of transmission lines;
   a plurality of first electrodes disposed on one side of the support;
   a solar cell module mounted on the support and electrically connected to a part of the plurality of first electrodes via a part of the plurality of transmission lines; and
   a plurality of second electrodes disposed on an opposite side of the support from the side on which the plurality of first electrodes is disposed, wherein
   the plurality of second electrodes includes a second electrode electrically connected one-to-one to the rest of the plurality of first electrodes via the rest of the plurality of transmission lines, and a second electrode electrically connected many-to-one to the rest of the first electrodes via the rest of the transmission lines,
   wherein the solar cell module includes
      a module electrode on the high potential side which is connected to one of the first electrodes of the part of the plurality of first electrodes via at least a first transmission line of the plurality of transmission lines, and
      a module electrode on the low potential side which is connected to another one of the first electrodes of the part of the plurality of first electrodes via at least a second transmission line of the plurality of transmission lines, the another one of the first electrodes being different from the one of the first electrodes which the module electrode on the high potential side is connected to,
   wherein each of the first electrodes, including the one of the first electrodes and the another one of the first electrodes, are disposed linearly along a first edge of the one side of the support,
   wherein each of the second electrodes are disposed linearly along a second edge of the opposite side of the support, and each one of three of the second electrodes is electrically connected to a same one of the first electrodes across the support from the first edge to the second edge via a respective one of three transmission lines of the plurality of transmission lines.

2. The solar power generator according to claim 1, wherein, when an external device is connected to the one side of the support, power generated by the solar cell module is transmitted to the part of the first electrodes and is output from the part of the first electrodes to the external device.

3. The solar power generator according to claim 2, wherein, when another solar power generator is connected to the opposite side of the support, power input from the another solar power generator to the second electrode electrically connected one-to-one to the rest of the first electrodes is transmitted to a connected first electrode among the rest of the first electrodes, and is output from the connected first electrode to the external device.

4. The solar power generator according to claim 1, wherein
the support includes a plurality of panels including a panel to which the solar cell module is attached and a panel to which the solar cell module is not attached,
the part of the transmission lines is provided on the panel to which the solar cell module is attached, and
the rest of the transmission lines is provided across the plurality of panels.

5. The solar power generator according to claim 1, wherein
the support includes a plurality of blankets including a blanket to which the solar cell module is attached and a blanket to which the solar cell module is not attached,
the part of the transmission lines is provided on the blanket to which the solar cell module is attached, and
the rest of the transmission lines is provided across the plurality of blankets.

6. A solar array wing comprising a plurality of solar power generators connected to one another, the solar power generators each being the solar power generator according to claim 1.

7. The solar array wing according to claim 6, wherein, among the plurality of solar power generators, the first electrode connected to the second electrode electrically connected many-to-one to the rest of the first electrodes in one of two of the solar power generators connected to each other is connected to one of the second electrodes electrically connected many-to-one to the rest of the first electrodes in another one of the two solar power generators.

8. The solar array wing according to claim 6, wherein at least two of the plurality of solar power generators have wiring of the same pattern as the rest of the transmission lines.

9. A space structure comprising:
the solar array wing according to claim 7; and
a structure body connected to the one side of the support of one of the plurality of solar power generators.

* * * * *